United States Patent [19]
Yializis et al.

[11] Patent Number: 6,146,462
[45] Date of Patent: Nov. 14, 2000

[54] STRUCTURES AND COMPONENTS THEREOF HAVING A DESIRED SURFACE CHARACTERISTIC TOGETHER WITH METHODS AND APPARATUSES FOR PRODUCING THE SAME

[75] Inventors: Angelo Yializis; Richard E. Ellwanger; Michael G. Mikhael; Wolfgang Decker, all of Tucson, Ariz.; C. Barry Johnson, Mt. Pleasant, S.C.; Gale Shipley, Mauldin, S.C.; Timothy D. O'Brien, Summerville, S.C.

[73] Assignee: AstenJohnson, Inc., Charleston, S.C.

[21] Appl. No.: 09/307,078

[22] Filed: May 7, 1999

Related U.S. Application Data

[60] Provisional application No. 60/084,768, May 8, 1998.

[51] Int. Cl.[7] .................................................. C23C 16/00
[52] U.S. Cl. ............................... 118/718; 118/723 HC; 118/723 FI
[58] Field of Search .................... 118/718, 723 E, 118/723 HC, 723 I, 729, 733, 723 FE; 156/345

[56] References Cited

U.S. PATENT DOCUMENTS

| 3,309,299 | 3/1967 | Mantell | 204/165 |
|---|---|---|---|
| 3,479,129 | 11/1969 | Friedlander et al. | 8/115.5 |
| 3,480,547 | 11/1969 | Van Dyk | 252/12.6 |

(List continued on next page.)

FOREIGN PATENT DOCUMENTS

| 0062491 | 10/1982 | European Pat. Off. | C08J 5/06 |
|---|---|---|---|
| 0168131 | 1/1986 | European Pat. Off. | C08J 5/06 |
| 0172057 | 2/1986 | European Pat. Off. | C08J 5/06 |
| 0191680A1 | 8/1986 | European Pat. Off. | C08J 5/06 |
| 0192510A1 | 8/1986 | European Pat. Off. | B29C 59/14 |
| 0492649B1 | 7/1992 | European Pat. Off. | D06M 10/10 |
| 0727508 | 8/1996 | European Pat. Off. | C23C 16/44 |
| 122692 | 10/1976 | Germany | D06C 1/02 |
| 61-035235 | 2/1986 | Japan | B29D 23/22 |
| 63-223043 | 9/1988 | Japan | C08J 7/16 |
| 4279092 | 10/1992 | Japan | H05K 3/38 |
| 2081611 | 2/1982 | United Kingdom . | |
| WO9424358 | 10/1994 | WIPO . | |
| 9627044 | 9/1996 | WIPO | D06M 10/02 |
| 9718692 | 5/1997 | WIPO | H05H 1/44 |
| 9727356 | 7/1997 | WIPO . | |
| 9905358 | 2/1999 | WIPO | D21F 1/00 |

OTHER PUBLICATIONS

Maike Rabe et al., "Hydrophobierung und Verbesserung der Farbechtheiten von Polyestergarn durch Plasmapolymerisation", Jun. 1994, pp. 513–517 (translation enclosed).

Bahners T. et al., "Anwendung der Niedertemperaturplasma–Technologie in der Textilvorbehandlung. Teil 1: Verfahren der Niedtemperaturplasma–Technologie", *Textil Praxis International*, vol. 49, No. 6, Jun. 1, 1994, pp. 422–424, (translation enclosed).

Oil Repellency: Hydrocarbon Resistance Test, Test Method 118–1997, American Association of Textile Chemists & Colorists Technical Manual, 1997, pp. 191–193.

Plasma Finishing: 5.1 Possibilities and Processes Today, Techtextil–Symposium '97 (May 14, 1997).

Plasma Treatment Basics, Sigma Labs (latest 1996).

Plasma Surface Modification and Plasma Deposition, NeoMecs web site (1996).

New: Atmospheric Plasma; March Instruments Inc. web site (1997).

Plasma and Surface Technology; Fraunhofer Institut Angewandte Materialforschung web site (1997).

(List continued on next page.)

*Primary Examiner*—Shrive Beck
*Assistant Examiner*—Parviz Hassanzadeh
*Attorney, Agent, or Firm*—Volpe and Koenig, P.C.

[57] ABSTRACT

Methods and apparatus for plasma modifying a substrate are disclosed along with associated techniques for applying coatings to the substrate. Particular utility has been found using a hollow cathode to generate the plasma along with magnetic focusing means to focus the plasma at the surface of a substrate.

9 Claims, 9 Drawing Sheets

U.S. PATENT DOCUMENTS

| | | | |
|---|---|---|---|
| 3,817,701 | 6/1974 | Torsen | 8/116 R |
| 4,206,258 | 6/1980 | Balcar | 428/131 |
| 4,218,509 | 8/1980 | Edgar et al. | 528/339 |
| 4,457,145 | 7/1984 | Sando et al. | 68/5 E |
| 4,466,258 | 8/1984 | Sando et al. | 68/5 C |
| 4,490,774 | 12/1984 | Olson et al. | 361/311 |
| 4,496,423 | 1/1985 | Walton . | |
| 4,499,520 | 2/1985 | Cichanowski | 361/311 |
| 4,507,539 | 3/1985 | Sando et al. . | |
| 4,513,349 | 4/1985 | Olson et al. | 361/311 |
| 4,515,931 | 5/1985 | Olson et al. | 526/323.2 |
| 4,533,710 | 8/1985 | Olson et al. | 526/323.2 |
| 4,586,111 | 4/1986 | Cichanowski | 361/323 |
| 4,601,911 | 7/1986 | Ueno et al. | 427/34 |
| 4,666,452 | 5/1987 | Nohr et al. | 8/115.52 |
| 4,699,847 | 10/1987 | Nakayama et al. | 428/522 |
| 4,722,515 | 2/1988 | Ham | 261/142 |
| 4,744,181 | 5/1988 | Moore et al. | 51/436 |
| 4,748,077 | 5/1988 | Skinner et al. | 428/224 |
| 4,803,332 | 2/1989 | Koyama et al. | 219/121.52 |
| 4,842,893 | 6/1989 | Yializis et al. | 427/44 |
| 4,947,592 | 8/1990 | Lloyd et al. | 51/436 |
| 4,954,371 | 9/1990 | Yializis et al. | 427/44 |
| 5,018,048 | 5/1991 | Shaw et al. | 361/323 |
| 5,032,461 | 7/1991 | Shaw et al. | 428/461 |
| 5,041,304 | 8/1991 | Kusano et al. | 427/41 |
| 5,097,800 | 3/1992 | Shaw et al. | 118/730 |
| 5,109,636 | 5/1992 | Lloyd et al. | 51/320 |
| 5,125,138 | 6/1992 | Shaw et al. | 29/25.42 |
| 5,169,499 | 12/1992 | Eagles et al. | 428/175 |
| 5,200,260 | 4/1993 | Hsu | 428/234 |
| 5,207,873 | 5/1993 | Sanduja et al. | 162/358.2 |
| 5,244,543 | 9/1993 | Fry | 162/358.2 |
| 5,283,110 | 2/1994 | Gardner et al. | 428/227 |
| 5,334,444 | 8/1994 | Bhoori et al. | 428/280 |
| 5,344,462 | 9/1994 | Paskalov et al. | 8/115.52 |
| 5,366,555 | 11/1994 | Kelly . | |
| 5,376,413 | 12/1994 | Callebert et al. | 427/489 |
| 5,391,855 | 2/1995 | Tanisaki | 219/121.43 |
| 5,407,736 | 4/1995 | McKeon | 428/225 |
| 5,455,108 | 10/1995 | Quincy et al. | 428/266 |
| 5,456,972 | 10/1995 | Roth et al. | 428/224 |
| 5,514,472 | 5/1996 | Baris et al. | 428/365 |
| 5,527,396 | 6/1996 | Saitoh et al. | 118/723 E |
| 5,622,773 | 4/1997 | Reiner et al. | 442/135 |
| 5,629,052 | 5/1997 | Trokhan et al. | 427/508 |
| 5,714,308 | 2/1998 | Romach et al. | 430/523 |
| 5,732,477 | 3/1998 | Toyama | 34/275 |
| 5,733,405 | 3/1998 | Taki et al. | 118/723 E |
| 5,753,886 | 5/1998 | Iwamura et al. . | |
| 5,767,469 | 6/1998 | Glocker et al. | 204/157.15 |
| 5,789,145 | 8/1998 | Glocker et al. . | |
| 5,853,493 | 12/1998 | Skelton et al. | 134/7 |
| 5,897,713 | 4/1999 | Tomioka et al. | 118/723 I |

OTHER PUBLICATIONS

Charles Tomasino, Jerome Cuomo, Plasma Treatment—Textiles, Annual Report Sep. 1, 1994–Sep. 30, 1995, NTC web site (1997 at latest).

Plasma Processing of Surfaces Using Pulsed Streamer Coronas, University of California, Lawrence Livermore National Laboratory, web site (1995).

Coburn, John W., Plasma Etching and RIE, AVS Short Course Program, Orlando, FL 1998 (Apr., 1998).

Banks, Bruce A. et al., Atomic Oxygen Textured Polymers, Technical Support Package: Details of Atomic–Oxygen Treatment of Polymer Surfaces, NASA Tech Briefs, LEW–15901. (1997 or earlier).

Bailey, Sheila G. Fatemi, Navid S., and Landis, Geoffrey A.: Texturing of InP Surfaces for Device Applications, Technical Support Package: More about Texture Etching of Indium Phosphide, NASA Tech Briefs, LEW–16212. (1997 or earlier).

Veitch, L.C.; and Phillip, W.H.; A Novel Method for Depositing Precious Metal Films on Difficult Surfaces, Technical Support Package: Depositing Pt on $Al_2O_3$ Fibers From a Guanidine–Based Solution, NASA Tech Briefs, LEW–16307. (1997 or earlier).

L. Pranevicius, Coating Technology: Ion Beam Deposition, Satas & Associates, Warwick, R.I. 1993.

D. Markgraf et al., Surface Treatment of Plastics: Technology and Applications, Seminar in Boston, Nov. 1996.

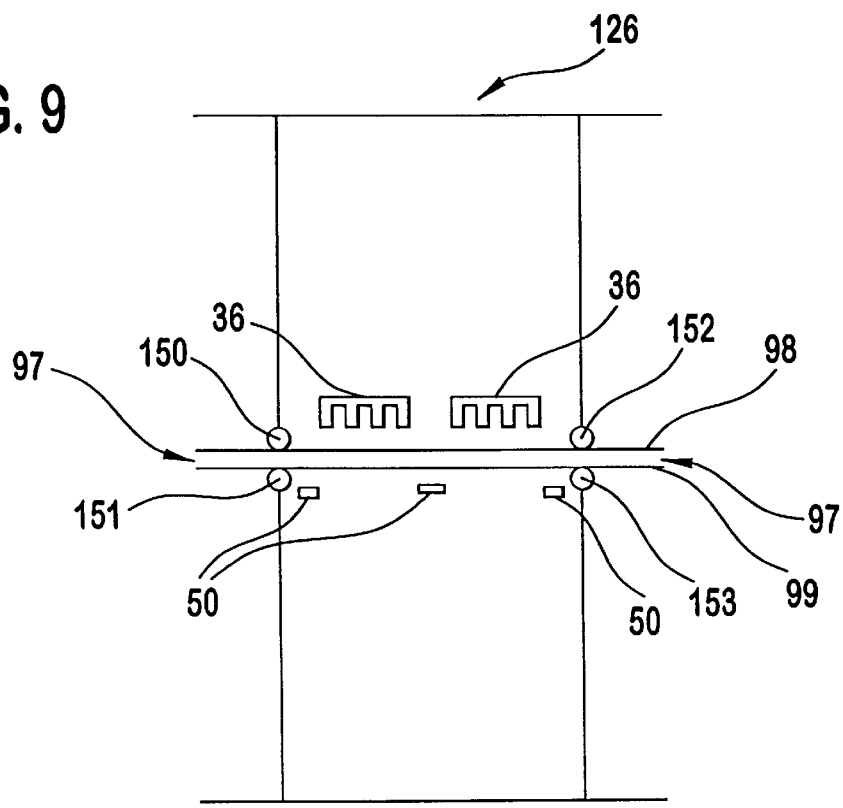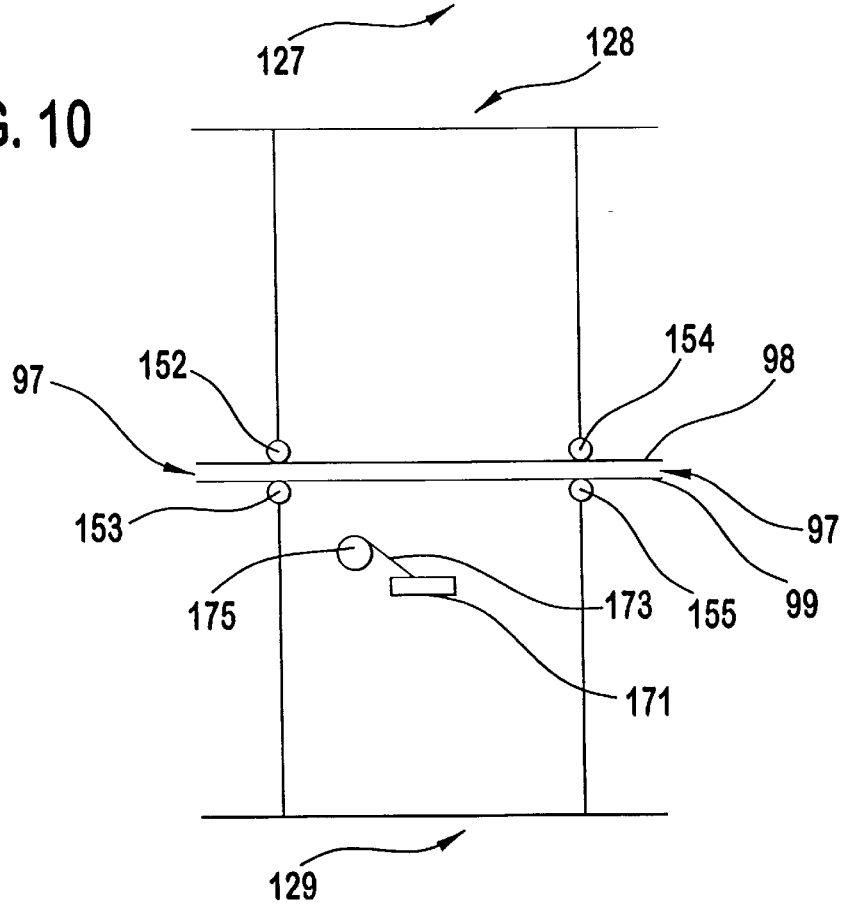

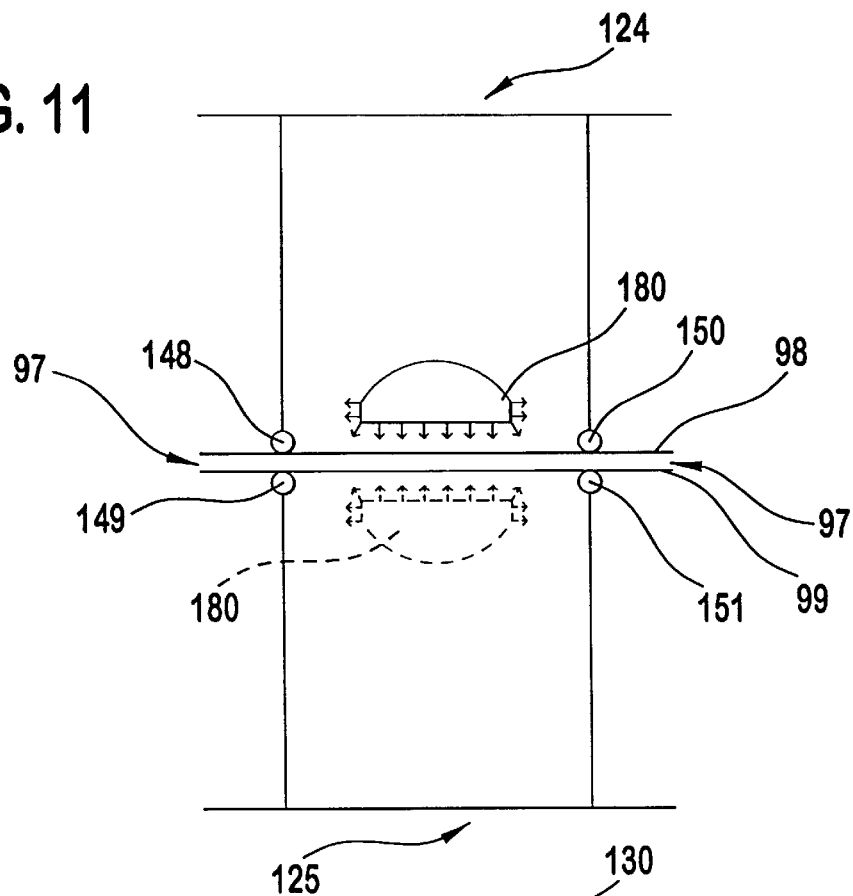
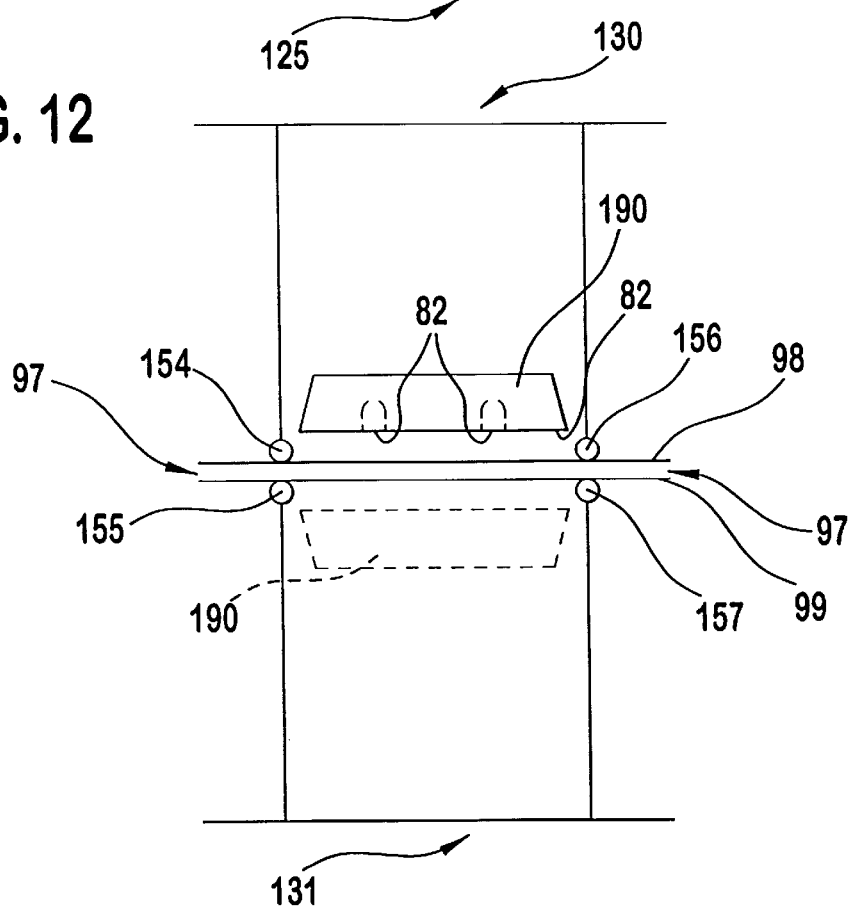

STRUCTURES AND COMPONENTS THEREOF HAVING A DESIRED SURFACE CHARACTERISTIC TOGETHER WITH METHODS AND APPARATUSES FOR PRODUCING THE SAME

This application claims benefit of Provisional Application Ser. No. 60/084,768 filed May 8, 1998.

BACKGROUND OF THE INVENTION

FIELD OF THE INVENTION

The present invention relates generally to structures and their components which have been treated with equipment and techniques that produce modifications to surface characteristics in either the structures or the components. More particularly, the present invention relates to equipment and techniques for treating substrates and components having commercial and industrial uses, particularly in industrial fabrics. Most particularly, the invention relates to plasma treated components and substrates together with equipment and techniques useful in treating the same in an efficient and accurate manner.

The prior art has recognized the advantages to be obtained by plasma treating and deposition techniques, at low pressure and at atmospheric pressure, to achieve desirable characteristics in a product. Most generally, the products treated in the prior art are single purpose products which were not intended to be exposed to a working condition or an active environment where the treated product is subjected to varying conditions over an extended time period. Furthermore, the prior art products were not exposed to varied treatment over time in a work environment. For example, industrial fabrics are frequently required to work under conditions of high mechanical stress and hostile environments. Special applications, like papermaking, require industrial fabrics that generally work in hot, moist and chemically hostile environments. As such, the fabric may be exposed to high water content in a formation step, heat, pressure and relatively high water content in a pressing step, and then, exposed to high temperatures in a drying step. Thus, the fabrics may see a variety of conditions in the process. Industrial fabrics may also be exposed to varying conditions in industries such as food processing, waste treatment, assembly line processes or surface painting and treating techniques.

The art has recognized that it would be desirable to have substrates and components with certain mechanical properties, such as strength, dimensional stability, and flexibility over extended periods. While these characteristics are desired as properties, it is sometimes desired to have surface properties which are contrary to these properties. For instance, it may be desirable to have a component which exhibits good internal resistance to moisture at its core while having an external affinity for moisture at its surface. It is not uncommon to have a conflict develop between the desired mechanical properties and the preferred surface properties. The prior art has recognized and there have been attempts at producing a mechanically robust core which supports a surface layer that has specific characteristics for the desired application. It has been recognized that important surface layer properties such as hydrophilicity, hydrophobicity, oleophilicity, oleophobicity, conductivity, chemical resistance and abrasion resistance may not necessarily be optimized in a single component which optimizes core properties such as strength, flexibility, and the like.

The present invention addresses the shortcomings of the prior art by providing structures and components which are treated with a highly efficient and controllable plasma treatment. If desired, the structure or component may be further enhanced or modified by exposure to a deposition treatment.

SUMMARY OF THE INVENTION

The present invention provides substrates and components having at least one inherent surface characteristic thereof modified by equipment and techniques which are particularly suitable for achieving that modification. The inherent surface property may be modified by a plasma treatment process which comprises the steps of providing a plasma treatment chamber which includes one or more hollow cathodes for generating a plasma within the chamber. The chamber includes means for focusing the generated plasma at the surface to be treated as it is introduced into the chamber and reacted with the plasma.

DESCRIPTION OF THE DRAWINGS

FIG. 9 shows an alternative arrangement of the plasma treatment chamber.

FIG. 10 shows a treatment chamber for metal deposition.

FIG. 11 shows a treatment chamber for vapor deposition of a monomer.

FIG. 12 shows a curing unit.

GLOSSARY

Figure 1:
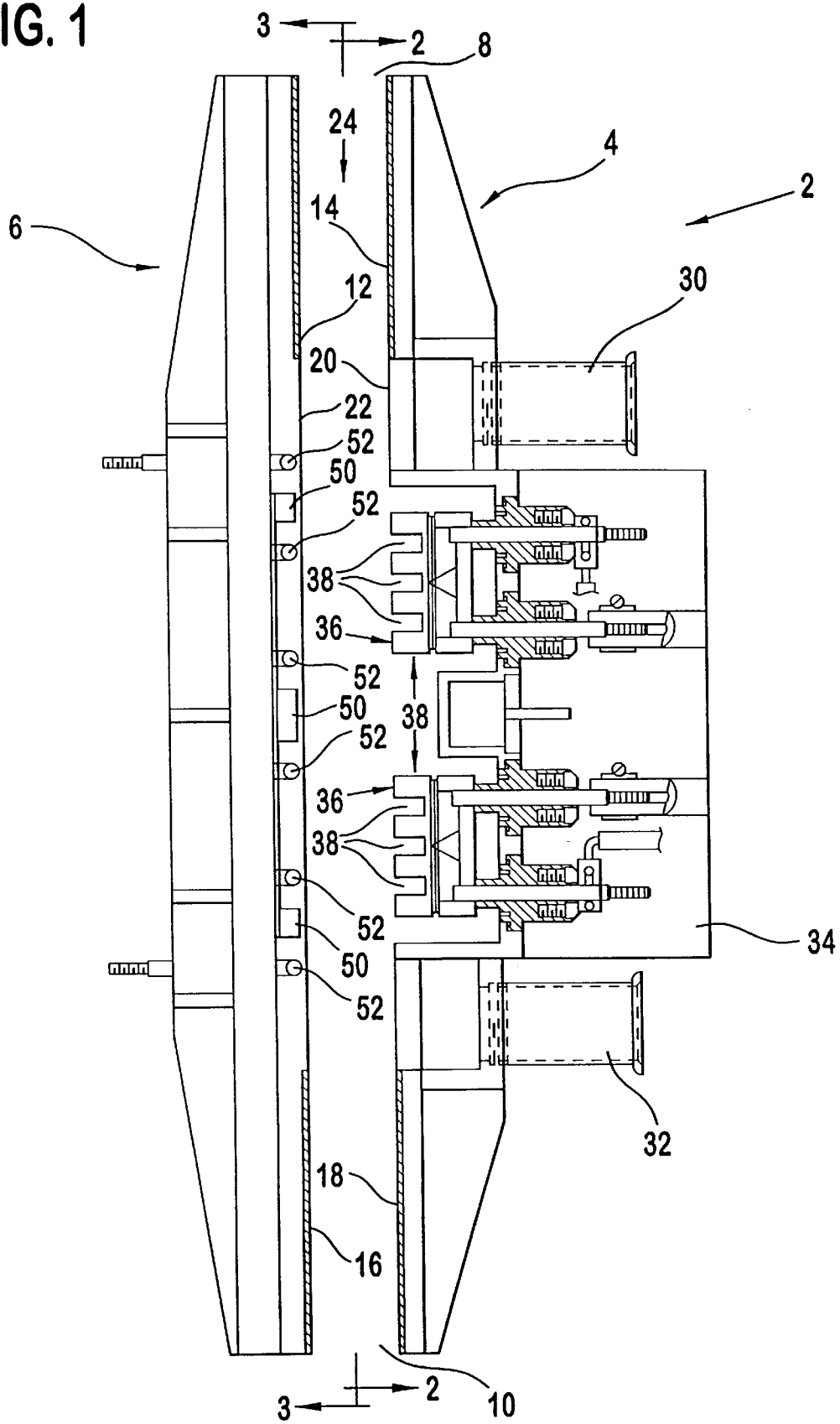
FIG. 1 is a side elevation showing a plasma treatment apparatus in accordance with the present invention in an opened condition.

A component is a structural or modular element that is capable of producing a structure when a plurality thereof are assembled together.

A fabric structure is formed by arranging individual strands in a pattern, such as by weaving, braiding, or knitting.

A fiber is a basic element of a textile and is characterized by having a length at least 100 times its diameter.

A filament is a continuous fiber of extremely long length.

A hollow cathode is an energy efficient chamber for generating a plasma.

An industrial fabric is one designed for a working function such as transport devices in the form of a moving or conveying belt.

An inherent property or characteristic is one that exists prior to any treatment by plasma or other means.

A monofilament is a single filament with or without twist.

A multifilament yarn is a yarn composed of more than one filament assembled with or without twist.

A nonwoven structure is a substrate formed by mechanical, thermal, or chemical means or a combination thereof without weaving, braiding, or knitting.

A plasma is a partially ionized gas; commonly ionized gases are argon, xenon, helium, neon, oxygen, carbon dioxide, nitrogen, and mixtures thereof.

A strand is a filament, monofilament, multifilament, yarn, string, rope, wire, or cable of suitable length, strength, or construction for a particular purpose.

A structure is an assemblage of a plurality of components.

A substrate is any structure, component, fabric, fiber, filament, multifilament, monofilament, yarn, strand, extrudate, modular element, or other item presented for plasma treatment or coating.

A web is an array of loosely entangled strands.

A yarn is a continuous strand of textile fibers, filaments, or material in a form suitable for intertwining to form a textile structure.

A 100% solids solution is a fluid such as a monomer, combination of monomers or other coating material which includes no carriers or solvent.

A 100% solids bath is a tank filled with a fluid such as a monomer, which includes no carriers or solvent.

DETAILED DESCRIPTION OF THE PREFERRED EMBODIMENTS

The preferred embodiments will be described with reference to the drawing Figures wherein like numerals indicate like elements throughout.

With reference to FIG. 1, there is shown plasma treatment chamber 2 which is useful in accordance with the present invention. Plasma treatment chamber 2 is divided into a plasma generating side 4 and a plasma focusing side 6. In use, the plasma generating side 4 and the plasma focusing side 6 are joined together in a sealed relationship except for openings 8 and 10 at the respective upper and lower ends. Entry and exit openings are created by the recesses 12, 14, 16 and 18. Since the pressure in the plasma treatment chamber 2 is preferably below atmospheric pressure, the recesses 12, 14, 16 and 18 will be provided with air locks of foam material or loop pile material, such as is available under the trade name Velcro®. Presently, a closed cell polyolefin, such as polyethylene or polypropylene, foam is preferred. When chamber 2 is closed, the walls 20 and 22 will form a channel 24 through the apparatus 2. A substrate passing between the air locks at openings 8 and 10 will pass into channel 24 and be sufficiently sealed against the atmosphere so as to maintain the desired vacuum level within the plasma treatment chamber 2. The vacuum in chamber 2 is drawn through the outlet ducts 30 and 32 by a suitable vacuum generating device as will be known to those skilled in the art. Currently, the plasma is being generated between 900 milli torr (0.900 torr) and 3 torr. In earlier trials, plasma was generated at up to 34 torr.

Figure 2:
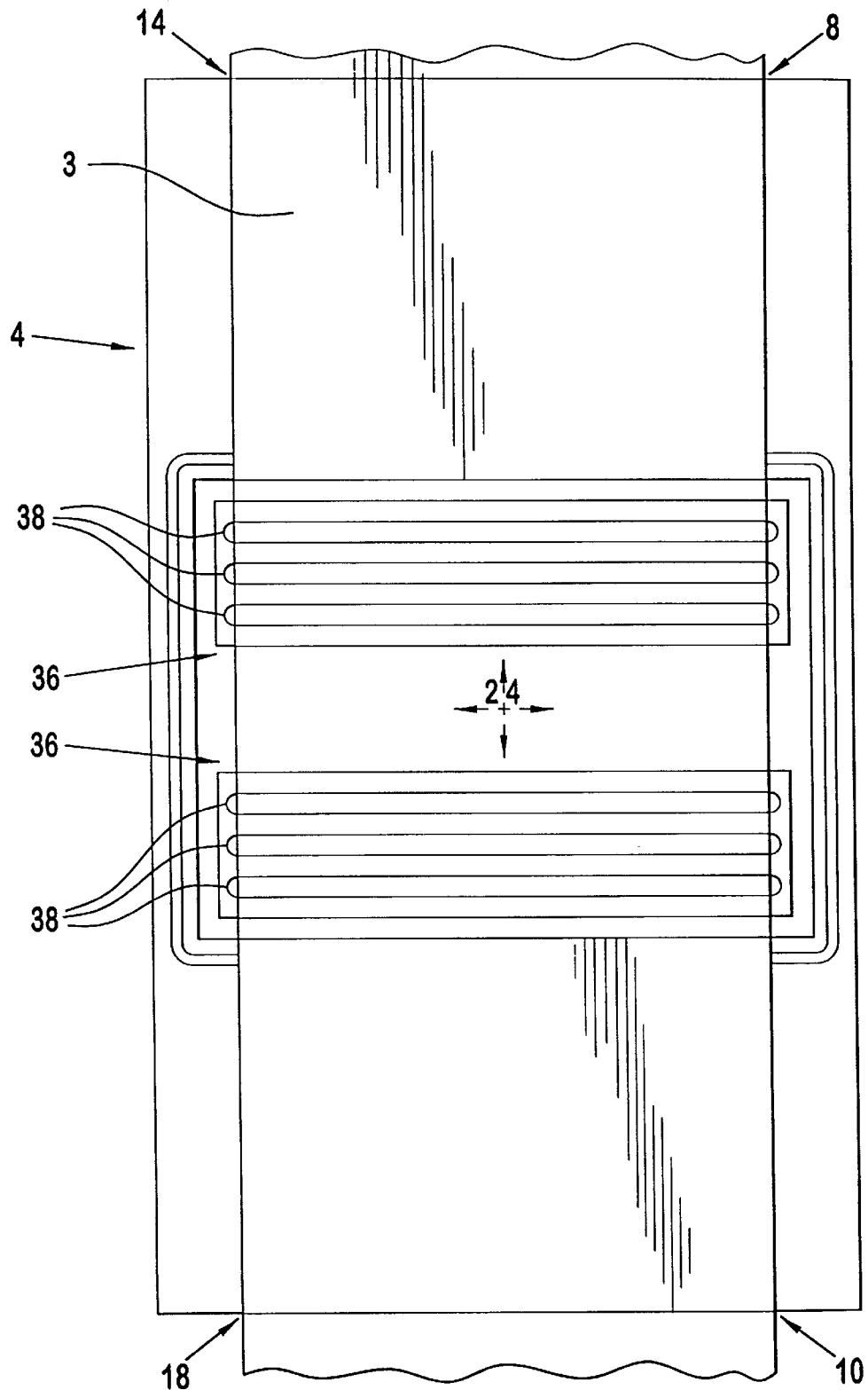
FIG. 2 is an elevation of the other side of the plasma treatment apparatus of FIG. 1 taken along the line 2—2 of FIG. 1.

With reference to FIG. 2, taken along line 2—2 of FIG. 1, there is illustrated a substrate 3 as it passes through the plasma treatment chamber 2 and the hollow cathode assemblies 36. As shown in FIGS. 1 and 2, the hollow cathode assemblies 36 define multiple hollow cathodes 38. The plasma generated in the hollow cathodes 38 will be initially focused in the vicinity of the substrate 3. Additional focusing of the plasma on the substrate is accomplished by the focusing means included in plasma focusing side 6.

Figure 3:
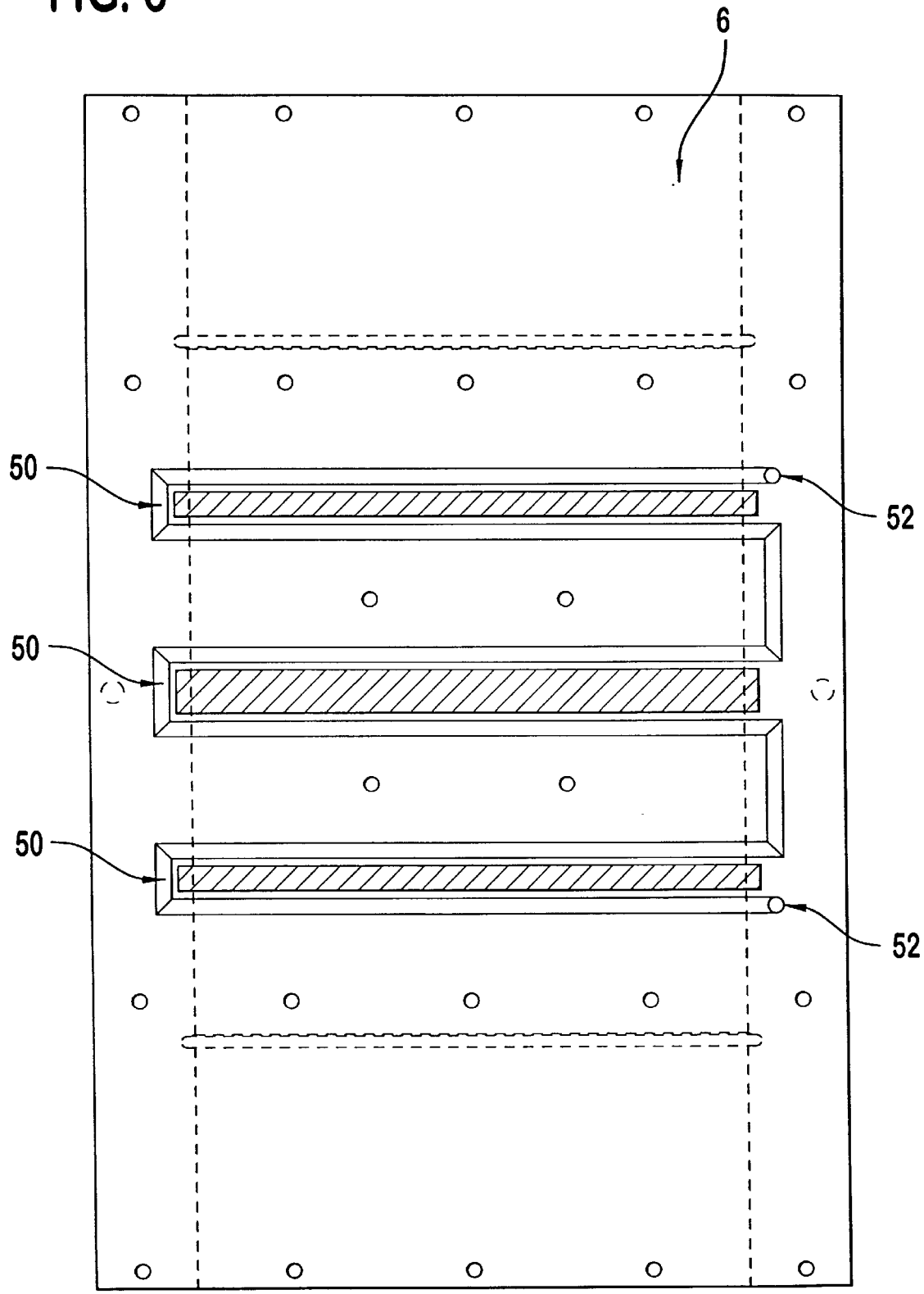
FIG. 3 is an elevation of one side of the plasma treatment apparatus of FIG. 1 taken along the line 3—3 of FIG. 1.

Turning now to FIG. 3, there is a view of the plasma focusing side 6 of plasma treatment apparatus 2 that is taken along the line 3—3 of FIG. 1. The plasma focusing side 6 includes a plurality of focusing arrays 50 which are located in space relative to each other so as to achieve a reinforcement of the magnetic focusing field. Surrounding the magnets 50 (shown in crosshatch for clarity) are the cooling ducts 52 which serve to control the temperature in the chamber, thereby protecting the magnets from overheating.

Plasma treatment to remove low molecular weight material or surface impurities will preferably use readily available, inexpensive, environmentally benign gases. In some applications, plasma treatment alone may be sufficient, however, it can be followed by coating with metals, ceramics, or polymerizable compounds. Preferred polymerizable compounds are radiation curable organic monomers containing at least one double bond, preferably at least two double bonds, especially alkene bonds. Acrylates are particularly well-suited monomers. Metals suitable for deposition include, but are not limited to Al, Cu, Mg, and Ti. Ceramics suitable for deposition include, but are not limited to, silicate-containing compounds, metal oxides particularly aluminum oxide, magnesium oxide, zirconium oxide, beryllium oxide, thorium oxides, graphite, ferrites, titanates, carbides, borides, silicides, nitrides, and materials made therefrom. Multiple coatings comprising metal, ceramic or radiation curable compound coatings are possible.

Plasma treatment leads to one or more of the following benefits: cleaning, roughening, drying, or surface activation. Plasma treatment can also lead to chemical alteration of a substrate by adding to a substrate or removing from a substrate, functional groups, ions, electrons, or molecular fragments, possibly accompanied by cross-linking.

All materials are of interest for plasma treatment or application of a secondary coating. Those of primary interest are polymers, such as aramids, polyesters, polyamides, polyimides, fluorocarbons, polyaryletherketones, polyphenylene sulfides, polyolefins, acrylics, copolymers and physical blends or alloys thereof. Preferred secondary layer coating thickness for polymers is in the range of 0.1 to 100 microns, more preferably 20 to 100 microns, most preferably 20 to 40 microns. Preferred metal or ceramic secondary layer coating thickness is in the range of 50 angstroms to 5 microns, more preferably 100 to 1000 angstroms. A preferred polymer is an acrylate of acrylic acid or its esters. The preferred acrylates have two or more double bonds.

Monoacrylates have the general formula

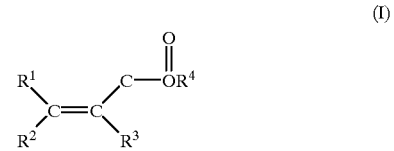

(I)

Wherein $R^1$, $R^2$, $R^3$, and $R^4$ are H or an organic group.

Diacrylates are acrylates of formula I wherein either $R^1$, $R^2$, $R^3$, or $R^4$ is itself an acrylate group. Organic groups are usually aliphatic, olefinic, alicyclic, or aryl groups or mixtures thereof (e.g. aliphatic alicyclic). Preferred monoacrylates are those where $R^1$, $R^2$ and $R^3$ are H or methyl and $R^4$ is a substituted alkyl or aryl group.

Preferred diacrylates have the formula

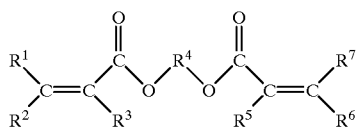

(II)

where $R^1$, $R^2$, $R^3$, $R^5$, $R^6$, $R^7$ are preferably H or methyl, most preferably H.

$R^4$ is preferably $C_2$–$C_{20}$ alkyl, aryl, multialkyl, multiaryl, or multiglycolyl, most preferably triethylene glycolyl or tripropylene glycolyl. The notation, $C_2$–$C_{20}$ alkyl, indicates an alkyl group with 2 to 20 carbon atoms.

$R^4$ in a mono- or multiacrylate is chosen to yield the desired surface properties after the monomer has been radiation cured to form a surface on a substrate. Table 1 contains a list of examples.

TABLE 1

| $R^4$ | Surface Properties |
|---|---|
| —$CH_2CH_2CH_2OCH_2CH_2CH_2OCH_2CH_2CH_2$— | Abrasion Resistance |
| —$CH_2CH_2OCH_2CH_2OCH_2CH_2$— | Abrasion Resistance |
| —$CH_2CH_2COOH$ | Hydrophilicity |
| —$CH_2CH_2OH$ | Hydrophilicity |

Formula I and II can also include triacrylate and other polyacrylate molecules. Mixtures of diacrylates can be copolymerized, for example a 50:50 mix of two structurally different diacrylates. Diacrylates can also be copolymerized with other polymerizable components, such as unsaturated alcohols and esters, unsaturated acids, unsaturated lower polyhydric alcohols, esters of unsaturated acids, vinyl cyclic compounds, unsaturated ethers, unsaturated ketones, unsaturated aliphatic hydrocarbons, unsaturated alkyl halides, unsaturated acid halides and unsaturated nitrites.

Diacrylates of interest also include 1,2-alkanediol diacrylate monomers of formula

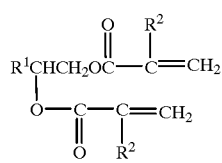

(III)

Where $R^1$ is in an acrylate radical having about 8 to 28 carbon atoms and $R^2$ is hydrogen or methyl (See for example U.S. Pat. No. 4,537,710).

The agent for promoting polymerization may be radiation, such as UV radiation or electron beam radiation. In some instances, it may be preferred to use a photoinitiator, such as an appropriate ketone.

Acrylate-based formulations of interest also include heterogeneous mixtures. These formulations contain a very fine dispersion of metal, ceramic, or graphite particles. These coatings are designed to enhance the abrasion resistance and/or the conductivity of the surface. For the photo-curing (UV/Visible) of these pigmented dark acrylate-based formulations, a long wave length (>250 nm) radiation source in combination with a compatible photoinitiator may be preferred.

Figure 4:
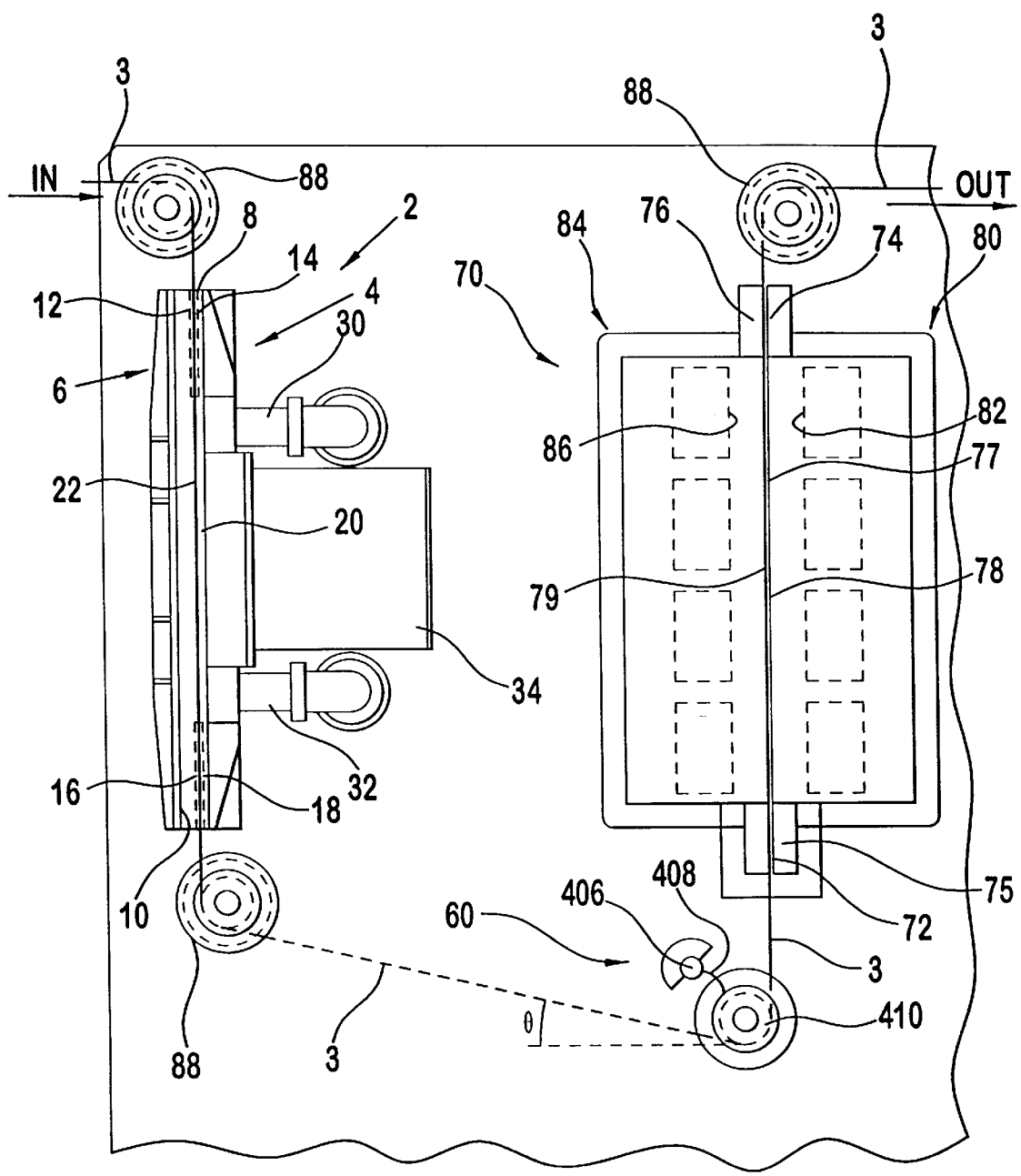
FIG. 4 is a side elevation of one arrangement for treating a substrate in accordance with the present invention.
Figure 5:
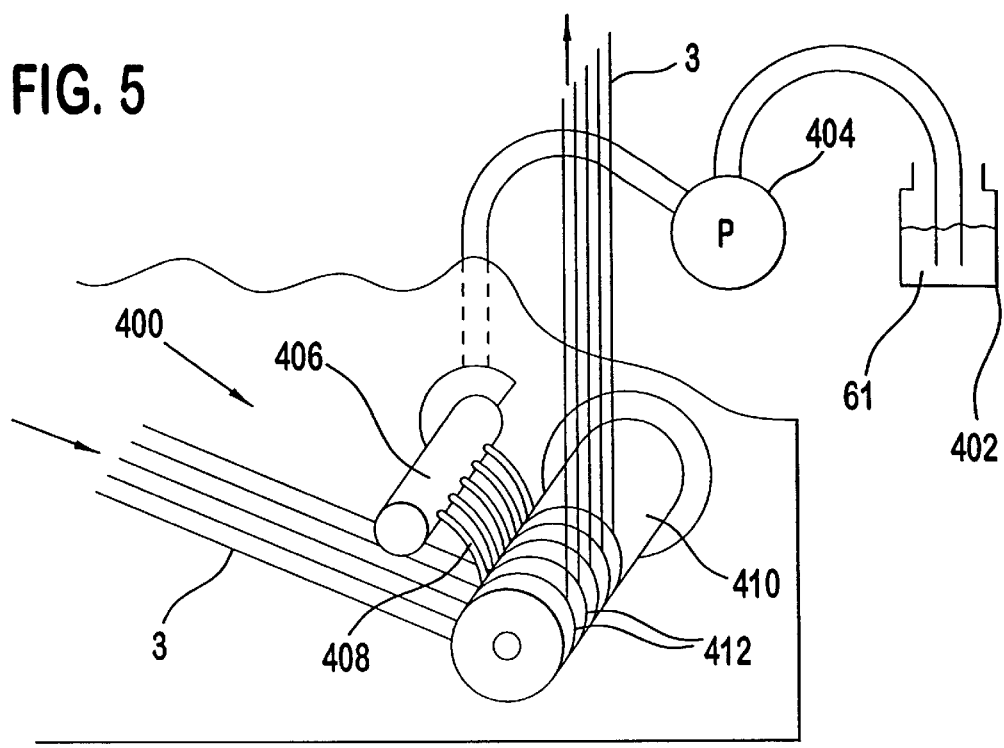
FIG. 5 is a partial cutaway perspective view of a capillary drip system.

Turning now to FIGS. 4 and 5, there are illustrated apparatuses for sequential plasma treatment, coating, and curing of a continuous substrate which may most easily be thought of as a strand 3. In FIG. 4, a plasma treatment apparatus 2, a coating applicator 60, and a curing unit 70, provide an integrated system for treatment of the strand 3. The direction of movement of the strand 3 is indicated by the in and out arrows. The strand 3 moves over a guide roller 88 and enters the plasma treatment apparatus 2 at the opening 8. To achieve uniform coverage, the strand 3 will not touch either wall 20 or wall 22. However, the strand 3 will pass closer to wall 22 than to wall 20. If it is desired to treat only one surface of a strand, the surface to remain untreated may be shielded, such as by contact with wall 22. After the strand 3 passes through channel 24, it exits the plasma apparatus 2 through opening 10.

In the preferred embodiment, the coating applicator 60, is a capillary drip system 400 including a reservoir 402, a pump 404, a dispensing manifold 406, a plurality of capillary tips 408, and a separating roller 410 having a plurality of grooves 412 dimensioned to receive a substrate as shown in FIG. 5. The coating solution 61 is pumped from the reservoir 402 into the dispensing manifold 406 and through the plurality of capillary tips 408. Each tip 408 is associated with a groove 412 in the separating roller 410. In this arrangement, the roller 410 may rotate or be held stationary. The strand 3 is directed to engage the roller 410 horizontally or at an angle up to 45° above horizontal. The strand 3 travels around the roller 410 and continues vertically upward into the curing unit 70. The variation in the initial angle θ determines how the strand 3 is coated. Depending on the angle θ, the strand contacts 25–50% of the roller 410 circumference. Use of this capillary tip system is accurate and efficient, requires less coating solution 61, and provides a more uniform coating than other methods. This approach is believed to be beneficial because it allows for remote location of the reservoir 402 away from potential curing radiation which may impact a dip bath.

Returning to FIG. 4, the strand 3 then enters into the curing apparatus 70 through channel 72 and passes out of the apparatus at channel 74. The channels 72 and 74 are defined by the extensions 75 and 76. The central channel 77 is defined by the walls 78 and 79 of the curing apparatus 70. After passing the last guide roller 88, the strand 3 is handled in the usual manner associated with normal production of an unmodified product.

In one embodiment, curing apparatus 70 has one section 80 with a plurality of UV lamps (one lamp is noted as 82) and an opposed section 84 with a plurality of opposing mirrors (one mirror is noted as 86). In a preferred arrangement for curing certain monomer coatings, there are up to four lamps, in opposed pairs. Each lamp is preferably adjustable for controlling their combined output. The sections 80 and 84 are hinged relative to each other to allow access for startup and repair. The UV light used for curing preferably emits radiation between 150 and 400 nanometers. The series of guide rollers 88 change the direction of the strand 3 so it passes continuously through plasma treatment apparatus 2, coating applicator 60, and curing apparatus 70.

The system components, plasma treatment apparatus 2, coating applicator 60, curing apparatus 70, and rollers 88, are secured in a stable manner to preserve the spacial relationship between them.

Figure 7:
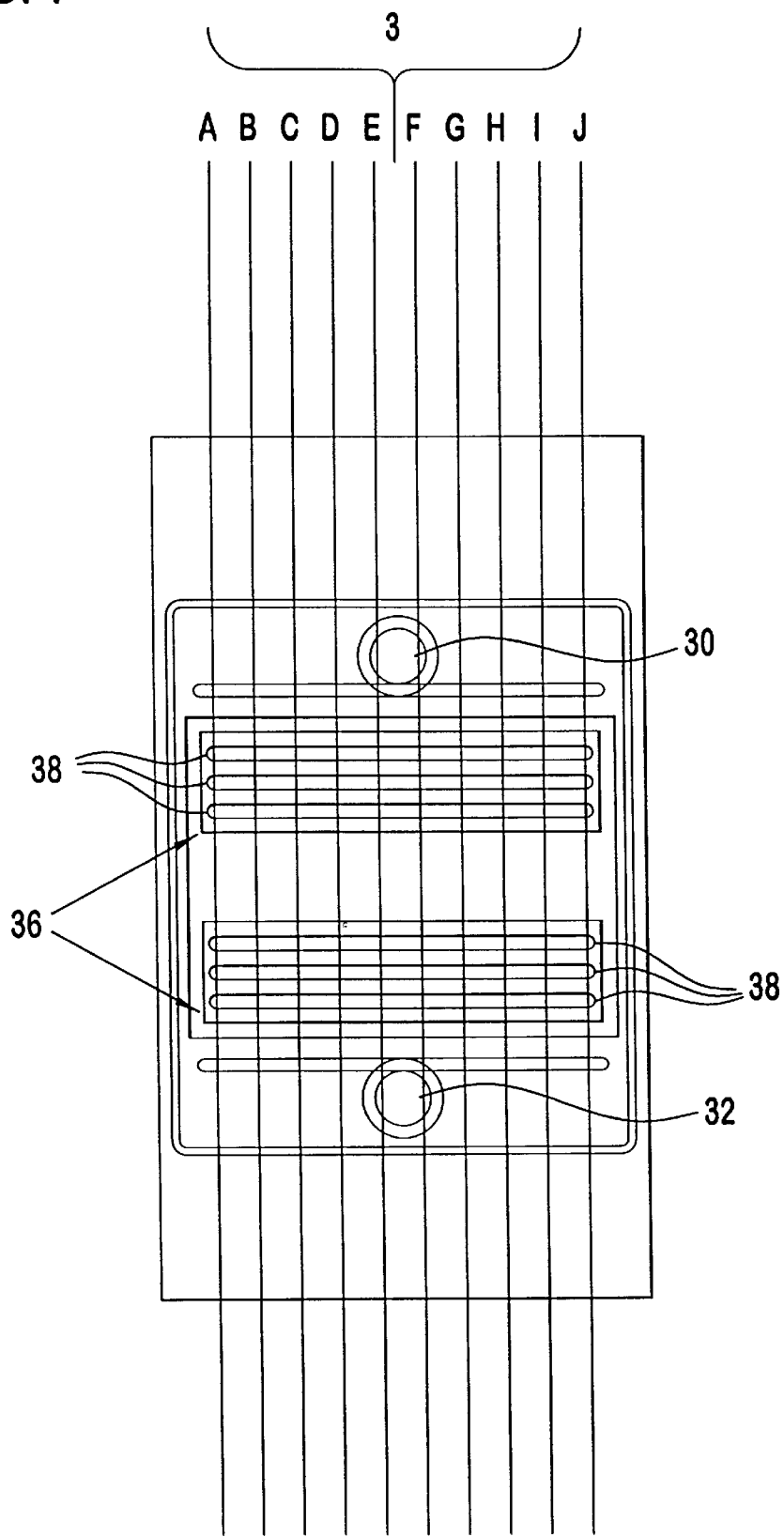
FIG. 7 is an elevation, similar to FIG. 2, showing a plurality of discrete substrates being treating simultaneously.

FIG. 7 illustrates the case for multiple strands 3, such as monofilaments, passing through the plasma treatment apparatus 2. The strands are spaced across the width, preferably in individual paths, so that the entirety of the strand is exposed to treatment. The individual strands are preferably guided by grooves cut in the rollers 88. Using a series of grooved rollers 88 keeps the strands in the desired relationship as they move through the treatment process.

The treated substrate is tested according to Test Method 118 developed by the American Association of Textile Chemists and Colorists (AATCC). Drops of standard test liquids, consisting of a selected series of hydrocarbons with varying surface tensions, are placed on the surface and observed for wetting, wicking, and contact angle. The oil repellency grade is the highest numbered liquid which does not wet the surface. The method was modified to test for water repellency, using test liquids of isopropanol and water in ratios of 2:98, 5:95, 10:90, 20:80, 30:70, and 40:60 (in percent by volume) numbered one through six respectively. If surface wetting does not occur within 10 seconds, the next test liquid is applied. Lower ratings indicate oleo-or hydrophilicity while higher ratings indicate oleo-or hydrophobicity.

EXAMPLE 1

Using a continuous treatment system shown in FIGS. 1–5, a plurality of strands are treated. An extruder is adjusted to produce 10 ends of a polyethylene terephthalate monofilament with a nominal size of 0.26 mm×1.06 mm. These sizes have a tolerance of 0.22–0.304 mm and 1.01–1.11 mm respectively, with an expected yield of 2900 denier. Additionally the yam would have a relative elongation at 3 grams per denier of 19%, and a free shrinkage at 200 degrees Centigrade of 6.5%. The production speed of the extruder line is set at 216.8 fpm, with the godet rolls and oven temperatures appropriately adjusted to give the specified yarn.

Immediately after exiting the extruder, nine of the ten strands are introduced into the plasma chamber, which is at 1.01 Torr, with constant induction of 400 ml/min of commercial grade Argon. The amplifier and tuner are adjusted to introduce 1326 Watts to the hollow cathode, with less than 10 Watts of reflected power. An external chiller is used, which maintains the temperature near room temperature, but above the dew point.

Upon exiting the plasma chamber, the nine ends are then directed to a grooved separator roll where monomer is applied. From a one inch manifold being supplied formulation MM2116 by a diaphragm pump, nine capillaries drop to individual grooves spaced evenly across the roller. The air-operated pump is adjusted with a micro air valve to supply a steady state of monomer to the monofilament. A weighing device is used to continually monitor the amount delivered. Coating thickness can be controlled by increasing or decreasing pump pressure, fiber speed or stopping the rotation of the roller.

After coating, the yarn proceeds directly upward, and enters the ultra violet cure box, which has three lamps operating. Two lamps are set on medium, and one is set on high, providing an immediate and complete cure of the monomer. In the upper section, two of the lamps are opposed to each other rather than having one lamp opposed by a mirror. Other applications may demand more or fewer lamps.

After the yarn exits the UV chamber, it continues down the line through a nip roll and onto the spools mounted on a conventional spool winder.

This particular run experienced an increase in the minor axis of 0.0274 mm and in the major axis of 0.1486 mm, causing an increase in weight of 178 grams per 9000 meters or approximately a 5.8% add on.

The resulting yarn has an oil, water rating of 4, 6 when tested with AATCC Test Method #118. The yarn was then woven into a filling float fabric using conventional processing methods. The yarn survives the rigors of warping and weaving without abrasion, or flaking indicating the coating is securely affixed. Resulting fabrics also have an oil, water rating of 4, 6 on one surface designated as the face. The untreated PET control has an oil, water rating of 0, 2–3.

In this particular example, a series of acrylate-based fluorinated monomer/oligomer formulations have been tested for this application. These materials cover a broad range of surface energies (hydrophobic/hydrophilic and oleophobic/oleophilic), crosslinking densities, abrasion resistance and adhesion to the substrate.

The formulation Sigma-MM-2116 is a solvent-free, acrylate based monomer/oligomer mix which contains 50–95% perfluorinated monoacrylate with fluorine content ranging from 30–64%. The formulation also contains 3–50% multi-functional, compatible crosslinking agents, e.g. di- and tri-acrylate monomers. Also 1–20% of an adhesion promoter was added to enhance diacrylate monomers functionalized with hydroxyl, carboxyl, carbonyl, sulfonic, thiol, or amino groups. The high fluorine content lowers the surface energy of the cured coating and turns the coated yarn into hydrophobic and oleophobic material. Combining the plasma treatment of the surface of the substrate with the functionalization of the coating with a specialty adhesion promoter formulation helps to achieve an excellent adhesion between the coating and the substrate while keeping the energy low, making the surface of the substrate both hydrophobic and oleophobic.

In addition to the formulation for hydrophobicity/oleophobicity, formulations are also contemplated in applications for electrostatic dissipation and abrasion resistance.

Figure 6:
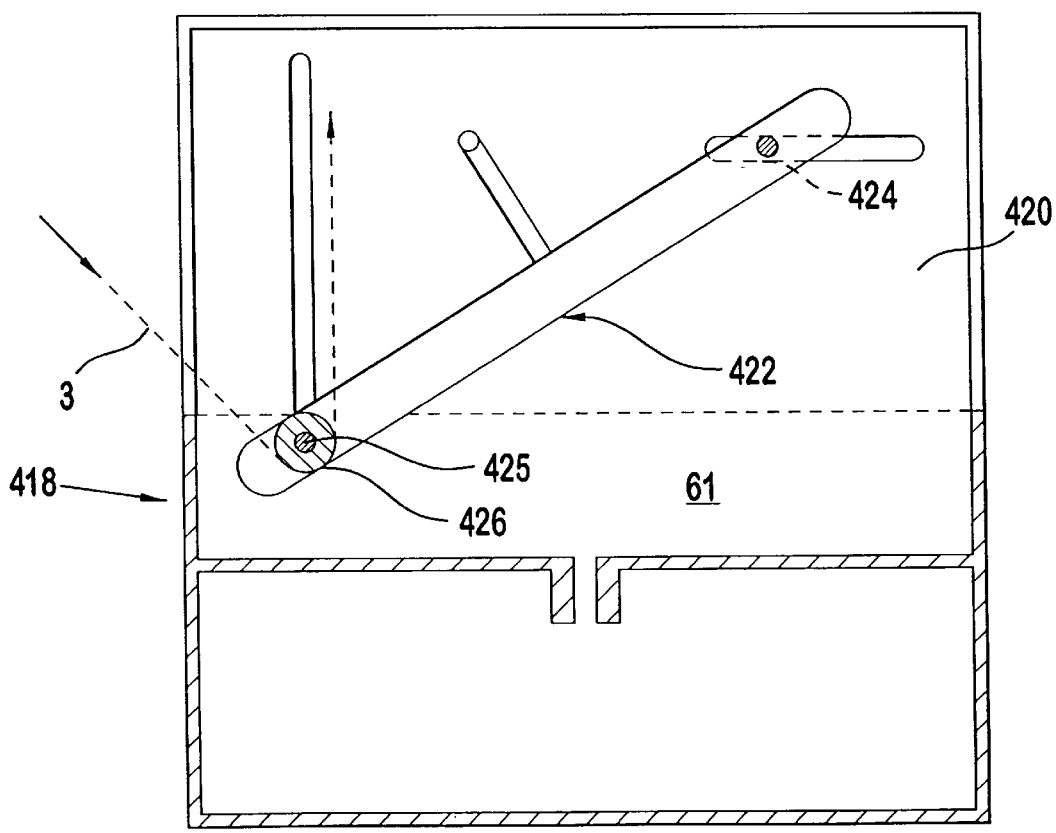
FIG. 6 is a side elevation of a solution bath.

Although the presently preferred embodiment uses the capillary drip applicator, initial efforts called for a monomer bath. As shown in the sectional view of FIG. 6, the bath 418 is essentially a tub 420 for holding the monomer solution 61 and a submersible frame 422 for controlling passage through the monomer solution 61. The frame 422 moves horizontally on shaft 424 and vertically on shaft 425. The depth of roller 426 in the monomer solution 61 may be controlled by fixing the position of shaft 425. When the roller 426 is submerged in the monomer solution 61, each strand 3 is passed around the roller 426 so that it will exit vertically from the bath as indicated by the broken line.

EXAMPLE 2

Using a continuous treatment system as shown in FIGS. 1 to 5, a polyethylene terephthalate (PET) monofilament of 0.5 mm diameter is treated. In this example, a sample monofilament is fed from the final extrusion process directly to the plasma treatment apparatus. The control sample is fed from the final extrusion process directly to a wind up roll. As used herein, directly means the absence of intermediate processing steps or storage between processing steps for an extrudate. The line speed in the test system is 200 ft/min but speeds up to 700 feet/min are employed during production. The gas in the plasma treatment apparatus may be 10% argon and 90% nitrogen but is more preferably 20% oxygen and 80% argon. The gas is introduced into the treatment chamber at a rate sufficient to achieve a stable plasma. The vacuum pressure is $10^{-1}$–$10^{-4}$ torr. Power supplied to the plasma chamber is about 2 kW (kilowatts). The power is created with direct current or alternating current but is preferably created with an alternating current in the range of 10 to 100 kHz, with 40 kHz being preferred. The monomer bath contains a solution of triethyleneglycol diacrylate. The lamps in the UV treatment apparatus are 15 inch Hanovia high pressure Hg lamps that generate 300 W/inch.

The treated monofilament is compared to the control monofilament by surface tension measurements using the oil and water tests described above.

It is preferred to use continuous or in-line processing where the substrate moves through the base processing step, such as extrusion, and plasma/coating treatment at the same speed.

Other alternative coating means may be used such as U shaped applicators, a kiss roll, eyelet applicators, and clam-shell eyelet applicators. In a more traditional finishing device, the strand passes through a liquid-filled U-shaped device, and emerges with a coating around its entire perimeter. Where capillary action can be used to carry a coating around the strand, a kiss roll applicator may be used. In this technique, the strand is coated when it "kisses" a liquid covered roller which is rotating with or against the strand's direction of travel. In yet another embodiment, the strand passes through an eyelet through which the coating is pumped. The eyelet may have a clam-shell design to avoid the need for threading the strand through the eyelet.

Figure 8A:
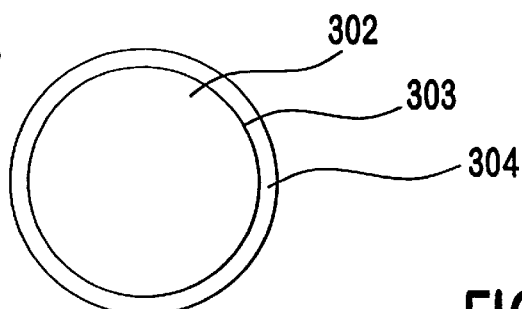
FIG. 8 shows a plurality of substrates A–F in cross-section with or without plasma treating and secondary coating.
Figure 8B:
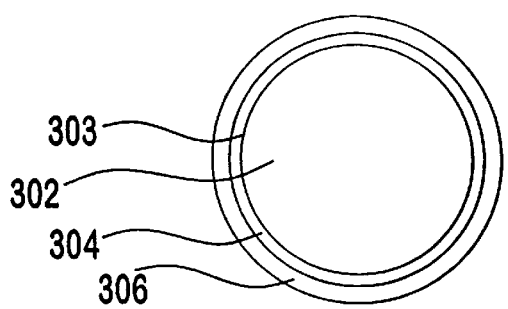
Figure 8C:
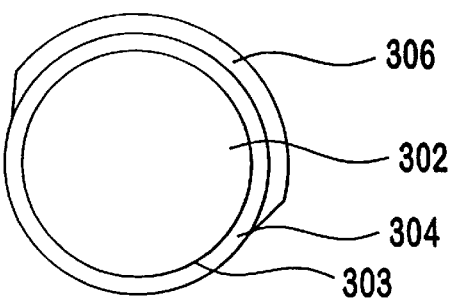
Figure 8D:
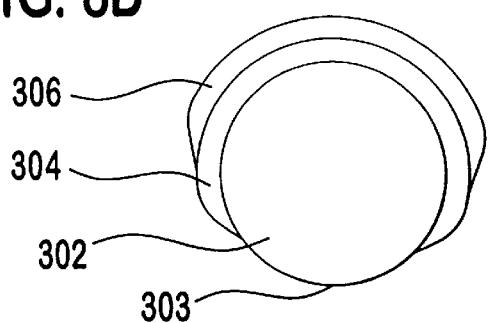
Figure 8E:
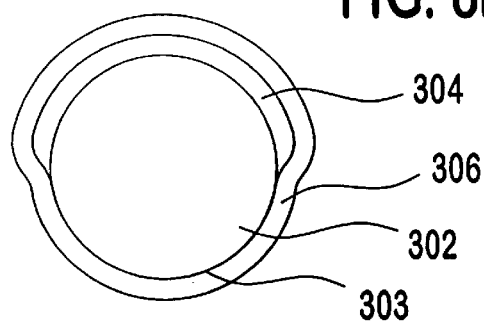

FIGS. 8A through 8G illustrate exemplary cross-sections of coated strands which are producible in accordance with the above example. All cross-sections are greatly exaggerated to permit demonstration of the point. In FIG. 8A, the substrate 302 has a plasma-treated outer surface 303 surrounded by a coating layer 304. More than one type of coating may be applied through repeated coating techniques. In FIG. 8B, the usually preferred embodiment, the first coating layer 304 and a secondary coating 306 surround the core 302. In FIG. 8C, the outer layer 306 is disposed only partly around the first coating layer 304. In FIG. 8D, the first coating 304 and the secondary coating 306 are disposed only partly around core 302. In FIG. 8E, the coating layer 304 is only partly around the core 302 but the coating 306 is completely around the core 302.

Figure 8F:
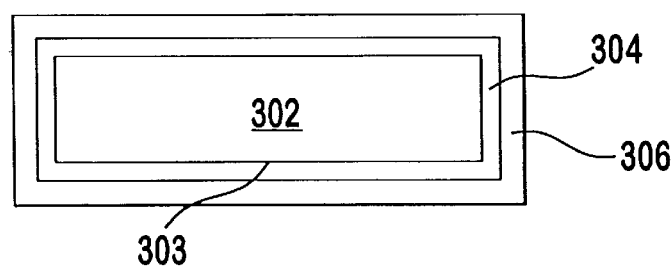
Figure 8G:
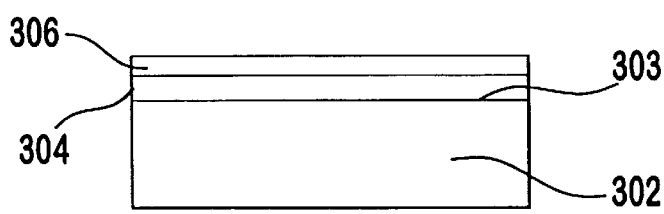

FIG. 8F illustrates exemplary cross-sections of rectangular strands. In FIG. 8F, the plasma-treated substrate 302, like in 7B, is coated with a first layer 304, such as a metal or polyacrylate, and a second layer, 306, such as a metal or polyacrylate. In FIG. 8G, like 7D, the substrate 302 is covered for a portion thereof by a first layer 304 and a second layer 306. Depending on the substrates dimensions, the cross-section in FIG. 8G can resemble that of a thin film.

In general, the coating is nonconformational. That is, it will tend to be self-leveling and will not conform to the geometry of the substrate.

FIGS. 9–12 show alternative plasma treatment chambers and coating and curing units.

FIG. 9 shows a representative upper chamber, 126 and a representative lower chamber, 127, to illustrate one treatment arrangement. In FIG. 9, upper chamber 126 has the hollow cathodes arrays 36 and 36, and lower chamber 127 has focusing magnets 50. The arrangement of FIG. 9 will plasma treat only the upper surface 98 of a substrate 97 when it is relatively dense. For an open, less dense substrate, like a web or open fabric, it may be possible to treat surfaces 98 and 99 at one time.

If desired, additional hollow cathodes arrays 36 may be located in the adjacent lower chamber and additional focusing magnets 50 may be located in the adjacent upper chamber 126, to simultaneously treat upper surface 98 and lower surface 99. FIG. 9 does not show a gas feed connection for introducing gas to be ionized or electrical connections linked to the cathodes as these connections will be known to those skilled in the art as a matter of design choice.

FIG. 10 shows a representative upper chamber 128 and a representative lower chamber 129 in an arrangement for metal deposition. Lower chamber 129 has resistively heated boats 171 and a supply of aluminum wire 173 on spool 175. As the wire 173 contacts the resistively heated boats 171, the wire is vaporized. It then condenses on the lower surface 99. Alternatively, one can create a ceramic coating by introducing oxygen in to chamber 129 to oxidize the aluminum and create aluminum oxide ($Al_2O_3$).

FIG. 11 shows a representative upper chamber 124 and a representative lower chamber 125 for creating a monomer layer on surface 98. A monomer vaporizer 180 creates a cloud of monomer vapor which will be deposited through condensation on the upper surface 98. If desired, a vaporizer 180, shown in phantom could be located as a mirror image in lower chamber 125.

FIG. 12 shows a representative upper chamber 130 that has a bank 190 of UV emitting lights 82 that irradiate and cure the monomers on surface 98. Alternatively, the radiation device can be one that emits an electron beam. If the substrate is treated on both surfaces a second bank 190, as shown in phantom will be located in chamber 131.

We claim:

1. An apparatus for plasma treating a textile substrate, the apparatus comprising:

a housing having entry and exit positions, plasma generating and plasma target sides opposite to each other with a substrate receiving channel extending therebetween, and air locks at the entry and exit positions for maintaining vacuum under operating conditions;

a cathode plasma generator comprising a plurality of hollow cathodes mounted on the plasma generating side; and a plurality of focusing arrays opposite to the plasma generator to focus the plasma across the channel and across a surface of the substrate as it passes through the channel.

2. The apparatus of claim 1 wherein the plasma focusing arrays are located on the plasma target side.

3. The apparatus of claim 1 wherein the plasma focusing arrays are magnetic.

4. The apparatus of claim 1 wherein the focusing arrays comprise an electromagnetic field generator.

5. An apparatus for modifying at least one surface characteristic of a textile substrate, the apparatus comprising:

a housing having entry and exit positions, a plasma generating side, a plasma target side opposite to the plasma generating side, a channel extending therebetween for passing the substrate between the sides of the housing and air locks at the entry and exit positions for maintaining vacuum under operating conditions;

a plasma generator comprising a plurality of hollow cathodes mounted on the plasma generating side;

a plurality of focusing arrays opposite to the plasma generator to focus the plasma across the surface of the substrate to be treated as it passes through the channel; and means for coating the plasma treated substrate.

6. The apparatus of claim 5 wherein the coating means comprises a coating solution bath through which the substrate passes.

7. The apparatus of claim 5 wherein the coating means comprises a capillary drip system including:

a coating solution reservoir;

a delivery manifold in communication with the reservoir; and a plurality of capillary tips for delivering the solution from the manifold to the substrate.

8. The apparatus of claim 7 wherein the coating means further comprises:

a roller having a plurality of grooves, equal in number to the plurality of capillary tips for positioning substrate beneath one of the plurality of capillary tips.

9. The apparatus of claim 5 further comprising means for curing the coating.

* * * * *